(12) United States Patent
Lee et al.

(10) Patent No.: US 12,720,970 B2
(45) Date of Patent: Aug. 25, 2026

(54) DISPLAY DEVICE

(71) Applicant: Samsung Display Co., Ltd., Yongin-si (KR)

(72) Inventors: Seung Chan Lee, Hwaseong-si (KR); Hong Am Kim, Seoul (KR); Young Min Cho, Seongnam-si (KR); Jin-Whan Jung, Chungcheongnam-do (KR); Wang Jo Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/402,428

(22) Filed: Aug. 13, 2021

(65) Prior Publication Data

US 2022/0216279 A1 Jul. 7, 2022

(30) Foreign Application Priority Data

Jan. 7, 2021 (KR) ........................ 10-2021-0002114

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC .. H10K 50/841; H10K 59/131; H10K 59/122; H10K 59/124; H10K 59/1201; H10K 59/123; H10D 86/60
See application file for complete search history.

(56) References Cited

U.S. PATENT DOCUMENTS

2004/0246765 A1* 12/2004 Kato ................. H01L 29/78621 257/E27.111
2012/0153814 A1* 6/2012 Lee ...................... H10K 50/841 313/317
2013/0200404 A1 8/2013 Lee et al.
2015/0207094 A1* 7/2015 Hwang ................ H10K 59/131 257/88
2016/0079334 A1* 3/2016 Lee ...................... H10K 59/122 438/34
2017/0262109 A1* 9/2017 Choi .................... H10D 86/411
2017/0317159 A1* 11/2017 Kim ..................... H10D 86/421
2018/0061895 A1 3/2018 Kim et al.
2018/0342707 A1 11/2018 Lee et al.
(Continued)

FOREIGN PATENT DOCUMENTS

CN 103247634 A 8/2013
KR 10-0560796 B1 3/2006
(Continued)

*Primary Examiner* — Samuel A Gebremariam
*Assistant Examiner* — Jonas T Beardsley
(74) *Attorney, Agent, or Firm* — Womble Bond Dickinson (US) LLP

(57) ABSTRACT

A display device including: a substrate including a display area and a non-display area; and a pad in the non-display area, wherein the pad includes a first electrode layer, a second electrode layer, a third electrode layer, and a fourth electrode layer sequentially on the substrate, the second electrode layer contacts the first electrode layer through a contact hole in a plurality of insulating layers, and an organic layer between the third electrode layer and the fourth electrode layer.

20 Claims, 23 Drawing Sheets

(56) References Cited

U.S. PATENT DOCUMENTS

| | | | | |
|---|---|---|---|---|
| 2019/0326370 | A1* | 10/2019 | Lu ...................... | H10K 59/1201 |
| 2020/0058727 | A1 | 2/2020 | Kim et al. | |
| 2021/0202641 | A1* | 7/2021 | Shin .................. | H10K 59/1216 |

FOREIGN PATENT DOCUMENTS

| | | | |
|---|---|---|---|
| KR | 10-0745129 | B1 | 8/2007 |
| KR | 10-1400284 | B1 | 5/2014 |
| KR | 10-2016-0141317 | A | 12/2016 |
| KR | 10-1942850 | B1 | 4/2019 |
| KR | 10-2019-0048785 | A | 5/2019 |
| KR | 10-2020-0021575 | A | 3/2020 |

* cited by examiner 420
410
162
143
161
142
A'
141
120
111
110
182(360)
H
OL
L4
L3
L2
L1
PD
OP
TL
A
Z 420
410
162
143
161
142
B'
141
120
111
110
H
L1 L2 L3 L4
PD
182(360) OP OL TL
B
Z 420
410
162
143
161
142
D'
141
120
111
110
H
182(360)
L4
L3
L2
L1
PD
OL
OP
TL
D
Z

FIG. 13D

Form organic layer on pads on the upper and lower sides

. . .

DISPLAY DEVICE

CROSS-REFERENCE TO RELATED APPLICATION

The present application claims priority to and the benefit of Korean Patent Application No. 10-2021-0002114 filed in the Korean Intellectual Property Office on Jan. 7, 2021, the entire content of which is incorporated herein by reference.

BACKGROUND

1. Field

Aspects of some embodiments of the present disclosure relate to a display panel and a display device including the same.

2. Description of the Related Art

A display device such as an emissive display device includes a display panel including pixels for displaying images. To control an operation of the display panel, the display panel may include at least one pad portion on which pads for input and output of signals are arranged. An integrated circuit (IC) chip or a flexible printed circuit film may be bonded to the pad portion.

The above information disclosed in this Background section is only for enhancement of understanding of the background and therefore the information discussed in this Background section does not necessarily constitute prior art.

SUMMARY

A greater number of pads may be utilized as resolution of the display device increases. To increase integrity of pads in a pad portion that is a limited region, a size of the pads may be reduced. Accordingly, when integrated circuit chips or flexible printed circuit films are bonded, a size of force applied to the pads may increase, and a probability that the pads are damaged may increase.

Embodiments provide a display device including reliability improved pads.

A display device according to some embodiments includes: a substrate including a display area and a non-display area, and a pad in the non-display area. The pad includes a first electrode layer, a second electrode layer, a third electrode layer, and a fourth electrode layer sequentially on the substrate, and the second electrode layer contacts the first electrode layer through a contact hole formed in a plurality of insulating layers. An organic layer is between the third electrode layer and the fourth electrode layer.

According to some embodiments, the organic layer may overlap an entire region of the contact hole.

According to some embodiments, an upper surface of the organic layer may be flat in a region in which the same overlaps the contact hole.

According to some embodiments, the organic layer may overlap the contact hole and the plurality of insulating layers, and an upper surface of the organic layer may be flat in a region in which the same overlaps the contact hole and a region in which the same does not overlap the contact hole.

According to some embodiments, an insulating layer may not be between the second electrode layer and the third electrode layer.

According to some embodiments, the fourth electrode layer may include an opening overlapping the organic layer.

According to some embodiments, the pad may further include a fifth electrode layer on the fourth electrode layer.

According to some embodiments, the fourth electrode layer and the fifth electrode layer may include an opening overlapping the organic layer.

According to some embodiments, the organic layer may extend in a length direction of the pad in a winding way.

According to some embodiments, the display device may further include a first gate insulating layer, a first gate conductive layer, a second gate insulating layer, a second gate conductive layer, a first inter-layer insulating layer, a first data conductive layer, a first planarization layer, a second data conductive layer, and a second planarization layer sequentially on the substrate in the display area. The second electrode layer may be on a same layer as the first data conductive layer, and the third electrode layer may be on a same layer as the second data conductive layer. The organic layer may be on a same layer as the second planarization layer.

According to some embodiments, the plurality of insulating layers may include the second gate insulating layer and the first inter-layer insulating layer.

According to some embodiments, the display device may further include a first gate conductive layer, a second gate conductive layer, a first data conductive layer, a second data conductive layer, and a pixel defining layer sequentially on the substrate in the display area. The first electrode layer may be on a same layer as the first gate conductive layer or the second gate conductive layer, the second electrode layer may be on a same layer as the first data conductive layer, and the third electrode layer may be on a same layer as the second data conductive layer. The organic layer may be on a same layer as the pixel defining layer.

A display device according to some embodiments includes a substrate including a display area and a non-display area; and a pad in the non-display area. The pad includes a first electrode layer, a second electrode layer, and a third electrode layer sequentially on the substrate, and the second electrode layer contacts the first electrode layer through a contact hole formed in a plurality of insulating layers. An organic layer is between the second electrode layer and the third electrode layer, and the organic layer overlaps an entire region of the contact hole.

According to some embodiments, an upper surface of the organic layer may be flat in a region in which the same overlaps the contact hole.

According to some embodiments, the organic layer may overlap the contact hole and the plurality of insulating layers, and an upper surface of the organic layer may be flat in a region in which the same overlaps the contact hole and a region in which the same does not overlap the contact hole.

According to some embodiments, the third electrode layer may include an opening overlapping the organic layer.

According to some embodiments, the display device may further include a first gate insulating layer, a first gate conductive layer, a second gate insulating layer, a second gate conductive layer, a first inter-layer insulating layer, a first data conductive layer, a first planarization layer, a second data conductive layer, and a second planarization layer sequentially on the substrate in the display area. The second electrode layer may be on a same layer as the first data conductive layer, the third electrode layer may be on a same layer as the second data conductive layer, and the organic layer may be on a same layer as the second planarization layer.

According to some embodiments, the plurality of insulating layers may include the second gate insulating layer and the first inter-layer insulating layer.

According to some embodiments, the display device may further include: a third gate insulating layer and a second inter-layer insulating layer between the first inter-layer insulating layer and the first planarization layer in the display area. The plurality of insulating layers may include the second gate insulating layer, the first inter-layer insulating layer, the third gate insulating layer, and the second inter-layer insulating layer.

According to some embodiments of the present disclosure, a display device including pads with relatively improved reliability may be provided. Further, according to some embodiments, various other characteristics may be included.

BRIEF DESCRIPTION OF THE DRAWINGS

FIG. 13A, FIG. 13B, FIG. 13C, FIG. 13D, and FIG. 13E respectively show a top plan view illustrating an organic film on a pad portion according to some embodiments.

DETAILED DESCRIPTION

Figure 1:
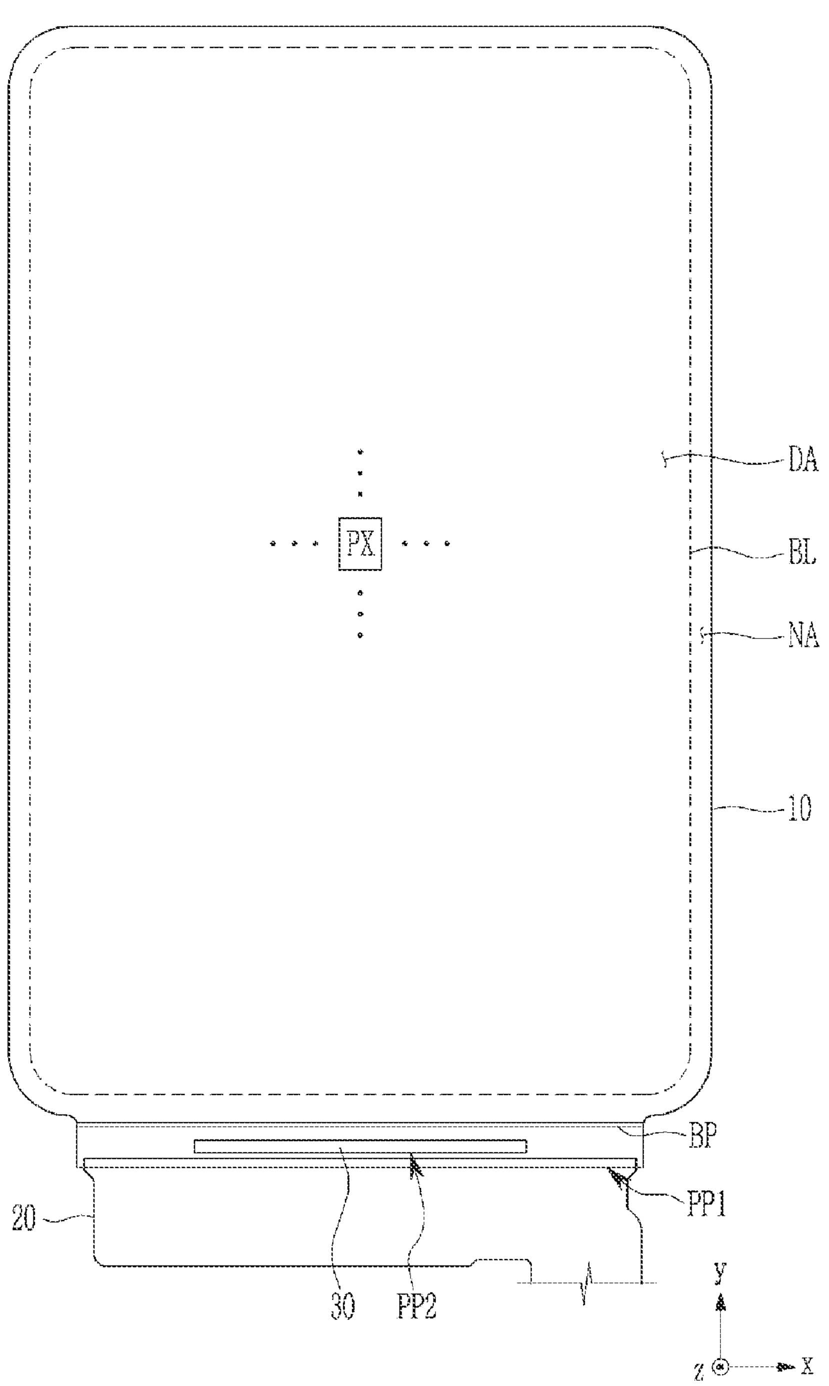
FIG. 1 shows a top plan view of a display device according to some embodiments.

Aspects of some embodiments of the inventive concept will be described more fully hereinafter with reference to the accompanying drawings, in which embodiments are shown.

The size and thickness of each configuration shown in the drawings are arbitrarily shown for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise", and variations such as "comprises" or "comprising", will be understood to imply the inclusion of stated elements but not the exclusion of any other elements.

Throughout the specification, when it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Terms "x", "y", and "z" are used, and here, "x" is a first direction, "y" is a second direction that is perpendicular to the first direction, and "z" is a third direction that is perpendicular to the first direction and the second direction. The first direction x, the second direction y, and the third direction z may correspond to a horizontal direction, a vertical direction, and a thickness direction of the display device.

Unless specifically described in the specification, "overlap" signifies overlapping in a plan view, and signifies overlapping in the third direction z.

FIG. 1 shows a top plan view of a display device according to some embodiments.

Referring to FIG. 1, the display device includes a display panel 10, a flexible printed circuit film 20 bonded to the display panel 10, and a driving unit including an integrated circuit chip 30.

The display panel 10 includes a display area DA that corresponds to a screen for displaying images, and a non-display area NA in which circuits and/or signal lines for generating and/or transmitting various signals applied to the display area DA are arranged. The non-display area NA may surround the display area DA. That is, the non-display area NA may be in a periphery (e.g., outside a footprint) of the display area DA. In FIG. 1, an inside and an outside of a border line BL respectively correspond to the display area DA and the non-display area NA. That is, the border line BL represents a boundary between the display area DA and the non-display area NA.

A plurality of pixels PX may be arranged as a matrix in the display area DA of the display panel 10. Although FIG. 1 illustrates a single pixel PX, embodiments according to the present disclosure are not limited thereto, and a person having ordinary skill in the art would recognize the display area DA may include a plurality of pixels PX. Signal lines including a gate line, a data line, a driving voltage line, and an initializing voltage line may be arranged in the display area DA. The gate line may substantially extend in a first direction x, and the data line and the driving voltage line may substantially extend in a second direction y. The initializing voltage line may include a voltage line substantially extend in the first direction x and a voltage line substantially extend in the second direction y, and may be arranged in a mesh formation or arrangement. Each pixel PX may be connected to the gate line, the data line, the driving voltage line, and the initializing voltage line, and may receive a gate signal, a data voltage, a driving voltage, and an initializing voltage from the signal lines. Each pixel PX may receive a common voltage. The pixel PX may be realized with a light emitting element such as a light emitting diode.

Additionally, according to some embodiments, a touch sensor for sensing a contact and/or non-contact touch input by a user may be arranged in the display area DA.

At least one pad portion PP1 and PP2 on which pads for inputting and outputting signals may be positioned in the non-display area NA of the display panel 10. The pad portion PP1 may be lengthily positioned in the first direction x along one edge of the display panel 10. That is, the pad portion PP1 may extend laterally along the first direction x. A flexible printed circuit film 20 may be bonded to the pad portion PP1, and pads of the flexible printed circuit film 20 may be electrically connected to the pads of the pad portion PP1. The pad portion PP2 may be positioned between the display area DA and the pad portion PP1. An integrated circuit chip 30 may be bonded to the pad portion PP2, and bumps of the integrated circuit chip 30 may be electrically connected to the pad portion PP2. An anisotropic conductive layer may be positioned between the pad portion PP1 and the flexible printed circuit film 20 and between the pad portion PP2 and the integrated circuit chip 30.

A driving unit for generating and/or processing various signals for driving the display panel 10 may be positioned in the non-display area NA of the display panel 10. The driving unit may include a data driver for applying a data voltage to data lines, a gate driver for applying a gate signal to gate lines, and a signal controller for controlling the data driver and the gate driver. The pixels PX may receive a data voltage at a timing (e.g., a set or predetermined timing) according to a gate signal generated by the gate driver. The gate driver may be integrated to the display panel 10, and may be positioned on at least one side of the display area DA. According to some embodiments, the data driver and the signal controller may be provided as an integrated circuit chip 30, although according to some embodiments, the data driver, the signal controller, and the gate driver may be separate components positioned on the display panel 10 (e.g., in the non-display area NA). The integrated circuit chip 30 may be bonded to the pad portion PP2 or may be bonded to the flexible printed circuit film 20, so it may be electrically connected to the display panel 10.

The display panel 10 may include a bending portion BP. The bending portion BP may be positioned across the display panel 10 in the first direction x between the display area DA and the pad portion PP2. The display panel 10 may be bent with a curvature radius (e.g., a set or predetermined curvature radius) with respect to a bending axis in parallel to the first direction x on the bending portion BP. When the display panel 10 is a top emission type, the pad portions PP1 and PP2 that are further distant from the display area DA than the bending portion BP is, the integrated circuit chip 30, and the flexible printed circuit film 20 may be bent to be positioned on a rear side of the display area DA. In the electronic device to which the display device is applied, the display panel 10 may be bent as described. The bending portion BP may be positioned in the display area DA and the non-display area NA.

Figure 2:
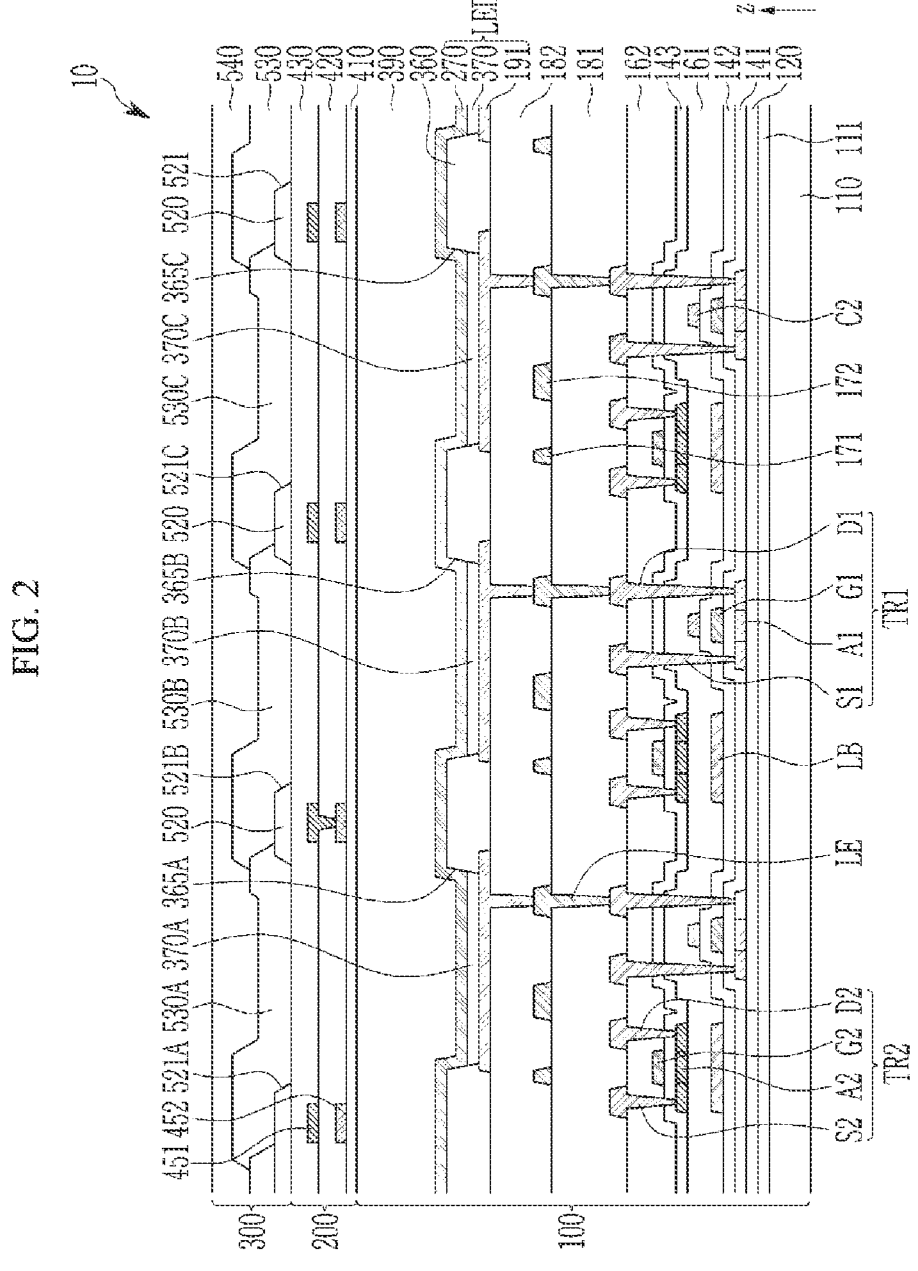
FIG. 2 shows a cross-sectional view of a display panel according to some embodiments.

FIG. 2 shows a cross-sectional view of a display panel according to some embodiments. A portion shown in FIG. 2 may correspond to substantially three pixel areas in the display area DA.

Referring to FIG. 1, the display panel 10 according to some embodiments may include a display unit 100, a touch portion (or touch sensor) 200, and an antireflection portion 300.

The display unit 100 may basically include a substrate 110, a first transistor TR1 and a second transistor TR2 formed on the substrate 110, and a light emitting diode LED connected to the first transistor TR1. The light emitting diode LED may correspond to the pixel PX.

The substrate 110 may be a flexible substrate including polymers such as a polyimide, a polyamide, or a polyethylene terephthalate. The substrate 110 may be a glass substrate.

A barrier layer 111 for preventing or reducing permeation of moisture or oxygen may be positioned on the substrate 110. The barrier layer 111 may include an inorganic insulating material such as a silicon nitride ($SiN_x$), a silicon nitride ($SiO_x$), or a silicon oxynitride ($SiO_xN_y$), and may be a single layer or a multilayer.

A buffer layer 120 may be positioned on the barrier layer 111. The buffer layer 120 may improve a characteristic of a semiconductor layer by blocking impurities from the substrate 110 in the case of forming the semiconductor layer, and may ease a stress of the semiconductor layer by flattening the surface of the substrate 110. The buffer layer 120 may include an inorganic insulating material such as a silicon oxide, a silicon nitride, or a silicon oxynitride. The buffer layer 120 may include amorphous silicon.

A semiconductor layer A1 of the first transistor TR1 may be positioned on the buffer layer 120. The semiconductor layer A1 may include a first region, a second region, and a channel region between the two regions. The semiconductor layer A1 may include polysilicon.

A first gate insulating layer 141 may be positioned on the semiconductor layer A1. The first gate insulating layer 141 may include an inorganic insulating material such as a silicon nitride ($SiN_x$), a silicon oxide ($SiO_x$), or a silicon oxynitride ($SiO_xN_y$), and may be a single layer or a multilayer.

A first gate conductive layer including a gate electrode G1 of the first transistor TR1 may be positioned on the first gate insulating layer 141. The first gate conductive layer may be made of a same material in a same process. The first gate conductive layer may include molybdenum (Mo), aluminum (Al), copper (Cu), and titanium (Ti), and may be a single layer or a multilayer.

A second gate insulating layer 142 may be positioned on the first gate conductive layer. The second gate insulating layer 142 may include an inorganic insulating material such as a silicon nitride, a silicon oxide, or a silicon oxynitride, and may be a single layer or a multilayer.

A light blocking layer LB, and a second gate conductive layer including an upper electrode C2 of a storage capacitor may be positioned on the second gate insulating layer 142. The upper electrode C2 may overlap a gate electrode G1, and an upper electrode C2, a gate electrode G1, and a second gate insulating layer 142 therebetween may configure a storage capacitor. The light blocking layer LB may prevent deterioration of the characteristic of the semiconductor layer A2 by blocking external light from reaching the semiconductor layer A2 of the second transistor TR2. The second gate conductive layer may be made of a same material in a same process. The second gate conductive layer may include molybdenum (Mo), aluminum (Al), copper (Cu), and titanium (Ti), and may be a single layer or a multilayer.

A first inter-layer insulating layer 161 may be positioned on the second gate conductive layer. The first inter-layer insulating layer 161 may include an inorganic insulating material such as a silicon nitride, a silicon oxide, or a silicon oxynitride, and may be a single layer or a multilayer. When the first inter-layer insulating layer 161 is a double layer, a lower layer may include a silicon nitride, and an upper layer may include a silicon oxide.

The semiconductor layer A2 of the second transistor TR2 may be positioned on the first inter-layer insulating layer 161. The semiconductor layer A2 may overlap the light blocking layer LB. The semiconductor layer A2 may include a first region, a second region, and a channel region between the regions. The semiconductor layer A2 may include an oxide semiconductor. The semiconductor layer A2 may include at least one of zinc (Zn), indium (In), gallium (Ga), or tin (Sn). For example, the semiconductor layer A2 may include an indium-gallium-zinc oxide (IGZO).

A third gate insulating layer 143 may be positioned on the semiconductor layer A2. The third gate insulating layer 143 may include an inorganic insulating material such as a silicon nitride, a silicon oxide, or a silicon oxynitride, and may be a single layer or a multilayer.

A third gate conductive layer including a gate electrode G2 of the second transistor TR2 may be positioned on the third gate insulating layer 143. The third gate conductive layer may be made of a same material in a same process. The third gate conductive layer may include molybdenum (Mo), aluminum (Al), copper (Cu), and titanium (Ti), and may be a single layer or a multilayer. For example, the third gate conductive layer may include a lower layer including titanium and an upper layer including molybdenum, and the lower layer may prevent fluorine (F) that is an etching gas from spreading when the upper layer is dry etched.

A second inter-layer insulating layer 162 may be positioned on the third gate conductive layer. The second inter-layer insulating layer 162 may include an inorganic insulating material such as a silicon nitride, a silicon oxide, or a silicon oxynitride, and may be a single layer or a multilayer. The second inter-layer insulating layer 162 may, for example, include a lower layer including a silicon nitride, and an upper layer including a silicon oxide.

A first data conductive layer including first electrodes S1 and S2 and second electrodes D1 and D2 may be positioned on the second inter-layer insulating layer 162. The first electrode S1 and the second electrode D1 may be respectively connected to the first region and the second region of the semiconductor layer A1 through contact holes formed in the insulating layers 141 142, 161, 143, and 162. One of the first electrode S1 and the second electrode D1 may be a source electrode and the other may be a drain electrode. The first electrode S2 and the second electrode D2 may be respectively connected to the first region and the second region of the semiconductor layer A2 through the contact holes formed in the insulating layers 143 and 162. One of the first electrode S2 and the second electrode D2 may be a source electrode and the other may be a drain electrode. The first data conductive layer may be made of a same material in a same process. The first data conductive layer may include aluminum (Al), platinum (Pt), palladium (Pd), silver (Ag), magnesium (Mg), gold (Ag), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multilayer. For example, the first data conductive layer may include a lower layer including a refractory metal such as molybdenum, chromium, tantalum, or titanium, a middle layer including a metal with low resistivity such as aluminum, copper, or silver, and an upper layer including a refractory metal.

The semiconductor layer A1, the gate electrode G1, the first electrode S1, and the second electrode S2 may configure a first transistor TR1. The first transistor TR1 may be a driving transistor or a transistor connected to one electrode of the driving transistor. The semiconductor layer A2, the gate electrode G2, the first electrode S2, and the second electrode D2 may configure a second transistor TR2. The light blocking layer LB may be electrically connected to the gate electrode G2 to function as a lower gate electrode of the second transistor TR2. The second transistor TR2 may be connected to the gate electrode G1 of the first transistor TR1.

A first planarization layer 181 may be positioned on the first data conductive layer. The first planarization layer 181 may be an organic insulating layer. For example, the first planarization layer 181 may include an organic insulating material such as a general all-purpose polymer such as poly(methyl methacrylate) or polystyrene, a polymer derivative having a phenol-based group, an acryl-based polymer, an imide polymer, a polyimide, and a siloxane-based polymer.

A second data conductive layer including a data line 171, a driving voltage line 172, and a connection electrode LE may be positioned on the first planarization layer 181. The connection electrode LE may be connected to the second electrode D1 of the first transistor TR1 through the contact hole formed in the first planarization layer 181. The second data conductive layer may be made of a same material in a same process. The second data conductive layer may include aluminum (Al), platinum (Pt), palladium (Pd), silver (Ag), magnesium (Mg), gold (Ag), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multilayer.

A second planarization layer 182 may be positioned on the second data conductive layer. The second planarization layer 182 may be an organic insulating layer. For example, the second planarization layer 182 may include an organic insulating material such as a general all-purpose polymer such as poly(methyl methacrylate) or polystyrene, a polymer derivative having a phenol-based group, an acryl-based polymer, an imide polymer, a polyimide, and a siloxane-based polymer.

A pixel conductive layer including a pixel electrode 191 may be positioned on the second planarization layer 182. The pixel electrode 191 may be connected to the connection electrode LE through the contact hole formed in the second planarization layer 182. The pixel electrode 191 may be electrically connected to the second electrode D1 of the transistor TR and may receive a data voltage for controlling luminance of the light emitting diode LED. The pixel conductive layer may be made of a same material in a same process. The pixel conductive layer may be provided for each pixel PX. The pixel conductive layer may include a metal such as silver (Ag), lithium (Li), calcium (Ca), aluminum (Al), magnesium (Mg), and gold (Ag). The pixel conductive layer may include a transparent conductive oxide (TCO) such as an indium tin oxide (ITO) or an indium zinc oxide (IZO).

A pixel defining layer 360 may be positioned on the pixel conductive layer. The pixel defining layer 360 may include pixel openings 365A, 365B, and 365C overlapping the pixel electrode 191. The pixel defining layer 360 may include an organic insulating material such as a general all-purpose polymer such as poly(methyl methacrylate) or polystyrene, a polymer derivative having a phenol-based group, an acryl-based polymer, an imide polymer, a polyimide, and a siloxane-based polymer. The pixel defining layer 360 may be a black pixel defining layer 360 including a black dye or pigment. The black pixel defining layer 360 may improve a contrast ratio, and may prevent reflection by the metal layer positioned below.

Emission layers 370A, 370B, and 370C may be positioned on the pixel electrode 191. At least some of the emission layer 370A, 370B, and 370C may be positioned in the pixel openings 365A, 365B, and 365C. The emission layers 370A, 370B, and 370C may include material layers for emitting light of basic colors such as red, green, and blue. The emission layers 370A, 370B, and 370C may have a structure in which material layers for emitting light of different colors are stacked. At least one of a hole injection layer, a hole transfer layer, an electron transfer layer, or an electron injection layer may be positioned on the pixel electrode 191 in addition to the emission layers 370A, 370B, and 370C.

A common electrode 270 may be positioned on the emission layers 370A, 370B, and 370C and the pixel defining layer 360. The common electrode 270 may be provided to all the pixels PX. The common electrode 270 may include metals such as calcium (Ca), barium (Ba), magnesium (Mg), aluminum (Al), silver (Ag), platinum (Pt), palladium (Pd), gold (Ag), nickel (Ni), neodymium (Nd), iridium (Ir), chromium (Cr), and lithium (Li). The common electrode 270 may include a transparent conductive oxide (TCO) such as an indium tin oxide (ITO) or an indium zinc oxide (IZO).

The pixel electrode 191, the emission layers 370A, 370B, and 370C, and the common electrode 270 configure a light emitting diode LED. The pixel electrode 191 may be an anode of the light emitting diode LED, and the common electrode 270 may be a cathode of the light emitting diode LED.

As described above, the semiconductor layer A1 of the first transistor TR1 may include a polycrystalline semiconductor, and the semiconductor layer A2 of the second transistor TR2 may include an oxide semiconductor. When the display panel 10 is driven at a high speed (e.g., a frequency of about 120 Hz) to increase display quality (particularly, display quality of video), power consumption may be increased. Therefore, a still image may be driven ata low speed (e.g., about 1 Hz to about 10 Hz) so as to simultaneously improve display quality and power consumption. A leakage current may be reduced as the semiconductor layer A2 of the second transistor TR2 that may cause a trouble of the leakage current at a low-speed driving includes the oxide semiconductor. The first transistor TR1 that has no problem of leakage current at a low-speed driving may have high electron mobility as the semiconductor layer A1 includes a polycrystalline semiconductor. That is, the first and second transistors TR1 and TR2 of one pixel PX different semiconductor materials, thereby improving display quality, power consumption, and reliability.

An encapsulation layer 390 may be positioned on the common electrode 270. The encapsulation layer 390 may prevent or reduce permeation of external moisture and oxygen by encapsulating the light emitting diode LED. The encapsulation layer 390 may be a thin film encapsulation layer including at least one inorganic layer and at least one organic layer.

A touch portion 200 may be positioned on the encapsulation layer 390.

The touch portion 200 may include a first insulating layer 410 positioned on the encapsulation layer 390. The first insulating layer 410 may cover the encapsulation layer 390 to protect the encapsulation layer 390 and may prevent or reduce permeation of moisture. The first insulating layer 410 may reduce parasitic capacitance between the common electrode 270 and the touch electrode 451.

A first touch conductive layer including a bridge 452 may be positioned on the first insulating layer 410, and a second insulating layer 420 may be positioned on the first touch conductive layer. A second touch conductive layer including a touch electrode 451 may be positioned on the second insulating layer 420, and a passivation layer 430 may be positioned on the second touch conductive layer.

The touch electrode 451 may include first touch electrodes and second touch electrodes for forming a mutual sensing capacitor. The bridge 452 may electrically connect the first touch electrodes or the second touch electrodes. For example, the first touch electrodes that are adjacent to each other and are separated from each other may be connected to the bridge 452 through the contact holes formed in the second insulating layer 420, and may be electrically connected through the bridge 452.

The first insulating layer 410 and the second insulating layer 420 may include an inorganic insulating material such as a silicon nitride, a silicon oxide, or a silicon oxynitride, and may be a single layer or a multilayer. The passivation layer 430 may include an inorganic insulating material such as a silicon nitride, a silicon oxide, or a silicon oxynitride or an organic material such as an acryl-based polymer or a polyimide-based resin. The first touch electrode layer and the second touch electrode layer may have a mesh shape having openings overlapping the pixels PX. The first touch electrode layer may be made of a same material in a same process. The second touch electrode layer may be made of a same material in a same process. The first touch electrode layer and the second touch electrode layer may include metals such as aluminum (Al), copper (Cu), titanium (Ti), molybdenum (Mo), silver (Ag), chromium (Cr), and nickel (Ni).

An antireflection portion 300 may be positioned on the touch portion 200.

The antireflection portion 300 may include a light blocking layer 520 and color filters 530A, 530B, and 530C.

The light blocking layer 520 may overlap the pixel defining layer 360 of the display unit 100, and may be narrower than the pixel defining layer 360. The light blocking layer 520 may include openings 521A, 521B, and 521C overlapping the pixel openings 365A, 365B, and 365C of the pixel defining layer 360.

The color filters 530A, 530B, and 530C may be positioned on the light blocking layer 520. A most of the respective color filters 530A, 530B, and 530C may overlap the openings 521A, 521B, and 521C of the light blocking layer 520. An overcoat layer 540 may be positioned on the color filters 530A, 530B, and 530C.

The antireflection portion 300 may prevent or reduce external light that is input from an outside from being reflected by a wire and being visible. A combination of the light blocking layer 520 and the color filters 530A, 530B, and 530C and may function as an antireflection layer. In the above-noted structure, a polarization layer may not be needed as the antireflection layer, thereby increasing light output efficiency and reducing a thickness of the display panel 10.

Figure 3:
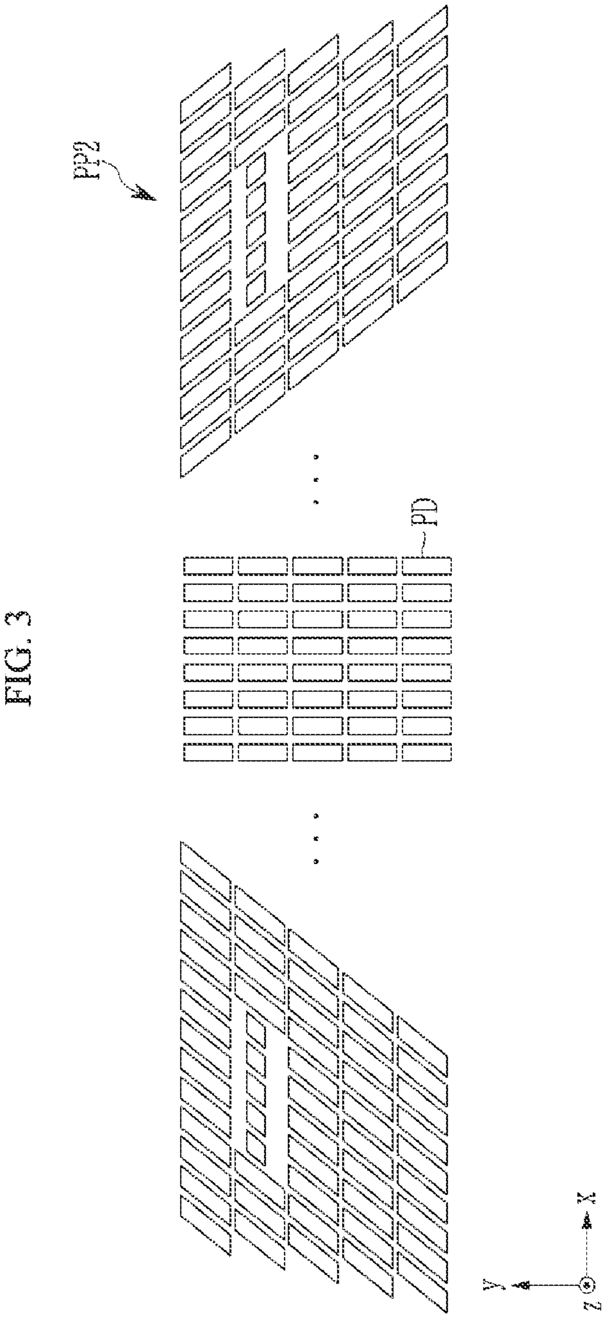
FIG. 3 shows a top plan view illustrating pads on a pad portion according to some embodiments.

FIG. 3 shows a top plan view illustrating pads on a pad portion according to some embodiments. The pads shown in FIG. 3 may be pads to which output terminals of the integrated circuit chip 30 are connected on the pad portion PP2.

Pads PD are arranged on the pad portion PP2 to which the integrated circuit chip 30 is bonded. The pads PD may include pads for transmitting signals (e.g., image data, signals relating thereto, and power) to the integrated circuit chip 30 and pads for receiving signals (e.g., a data voltage and a gate driver controlling signal) from the integrated circuit chip 30. The illustrated pads PD may be pads for receiving signals from the integrated circuit chip 30, that is, pads connected to output terminals of the integrated circuit chip 30. Most of the pads PD may be electrically connected to data lines positioned in the display area DA, and may receive data voltages applied to the pixels PX through data lines from the integrated circuit chip 30. To electrically connect the signal lines such as data lines and the pads PD, wires connected to the pads PD may be positioned between the pad portion PP2 and the display area DA.

A plurality of pads (e.g., several thousand) may be located on the pad portion PP2 according to high resolution of the display device, so the pads PD may be arranged in a plurality of rows. In the respective rows, the pads PD may be arranged along the first direction x with a gap (e.g., a set or predetermined gap). The respective pads PD may have a quadrangular planar shape. The pad PD may have a long side (length) and a short side (width). The short side of the pad PD may be parallel to the first direction x. On the pad portion PP2, the long side of the pads PD positioned in a left region and a right region may be inclined in the first direction x and the second direction y. The pad PD may have substantially the same lengths of the long side and the short side, and may have various planar shapes.

Figure 4A:
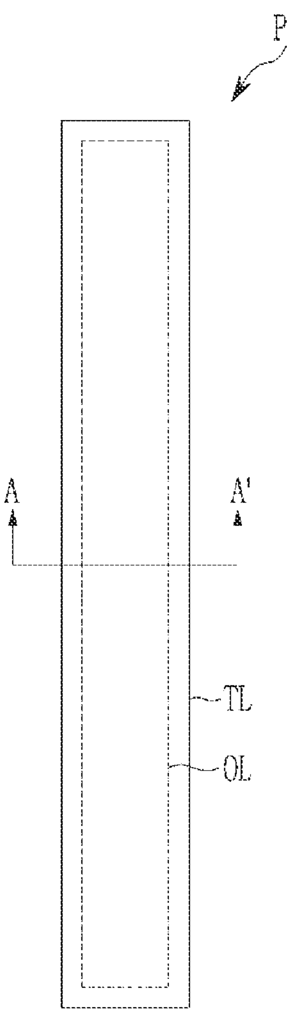
FIG. 4A shows a top plan view of a pad according to some embodiments.
Figure 4B:
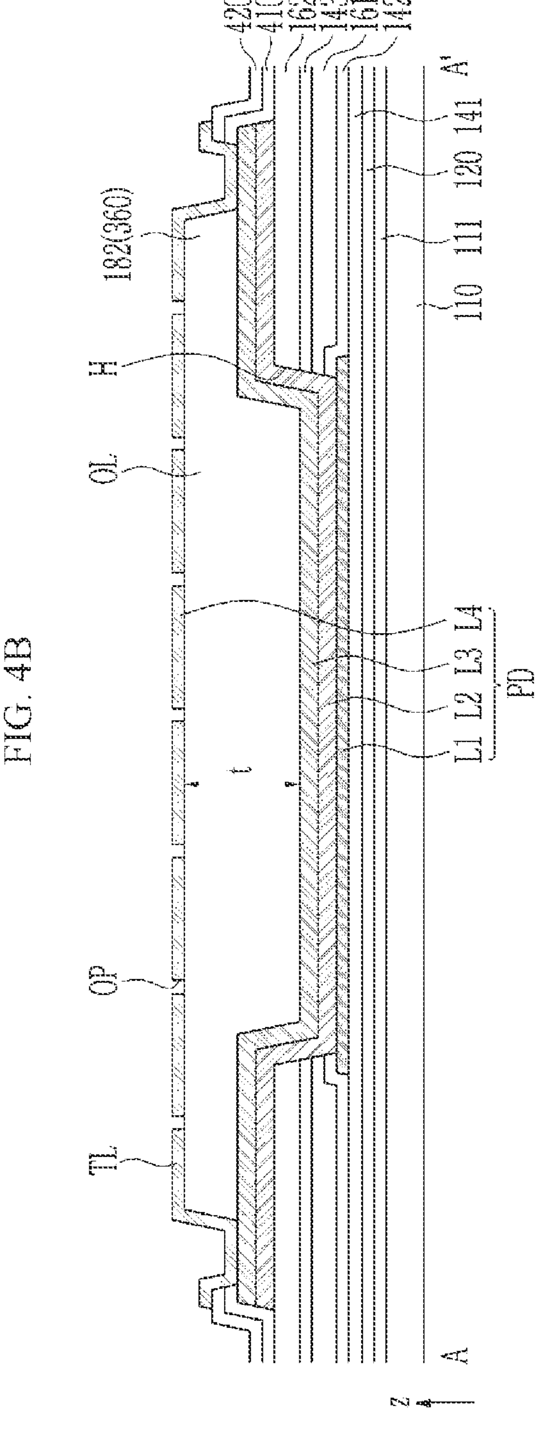
FIG. 4B and FIG. 4C show cross-sectional views with respect to a line A-A' of FIG. 4A according to some embodiments.
Figure 4C:
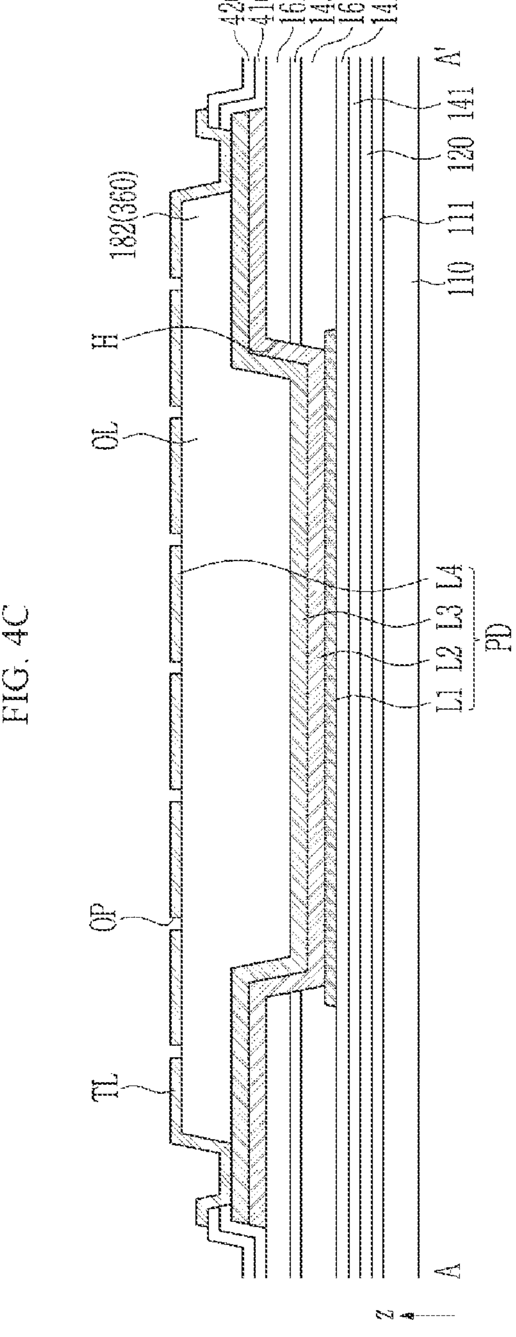

FIG. 4A shows a top plan view of a pad according to some embodiments, and FIG. 4B and FIG. 4C show cross-sectional views with respect to a line A-A' of FIG. 4A according to some embodiments. FIG. 4A, FIG. 4B and FIG. 4C show one of the pads PD positioned on the pad portion PP2. FIG. 4A shows an edge of a top layer TL of the pad PD and an edge (dotted line) of the organic layer OL provided below the same.

Referring to FIG. 4A and FIG. 4B, at least some of the insulating layers and the conductive layers positioned in the display area DA may be positioned in the pad portion PP2. The pad PD may be configured with conductive layers positioned in the display area DA. Therefore, when the pad PD is described, a relationship of the insulating layers and the conductive layers positioned in the display area DA will also be described.

The pad PD may include a first electrode layer L1, a second electrode layer L2, a third electrode layer L3, and a fourth electrode layer L4 positioned on the substrate 110. The fourth electrode layer L4 is the top layer TL of the pad PD.

A barrier layer 111, a buffer layer 120, and a first gate insulating layer 141 may be positioned between the substrate 110 and the first electrode layer L1. They may be made of a same material in a same process as the gate electrode G1 of the first transistor TR1. That is, the first gate conductive layer may include a gate electrode G1 and a first electrode layer L1. An end of the first electrode layer L1 may be connected to a wire for electrically connecting the pad PD and the signal line such as a data line. The first electrode layer L1 may be an expansion of the wire.

A second gate insulating layer 142, a first inter-layer insulating layer 161, a third gate insulating layer 143, and a second inter-layer insulating layer 162 may be positioned on the first electrode layer L1. The second electrode layer L2 may contact the first electrode layer L1 through a contact hole H formed in the insulating layers 142, 161, 143, and 162. The second electrode layer L2 may be made of a same material in a same process as the first electrodes S1 and S2 and the second electrodes D1 and D2 of the first and second transistors TR1 and TR2. That is, the first data conductive layer may include first electrodes S1 and S2, second electrodes D1 and D2, and a second electrode layer L2.

A barrier layer 111, a buffer layer 120, a first gate insulating layer 141, a second gate insulating layer 142, a first inter-layer insulating layer 161, a third gate insulating layer 143, and a second inter-layer insulating layer 162 that may be inorganic insulating layers may be positioned between an edge of the second electrode layer L2 and the substrate 110.

A third electrode layer L3 may be positioned on the second electrode layer L2. The third electrode layer L3 may be made of a same material in a same process as the data line 171 and the driving voltage line 172. That is, the second data conductive layer may include a data line 171, a driving voltage line 172, and a third electrode layer L3. A first planarization layer 181 positioned between the first data conductive layer and the second data conductive layer may not be positioned on the pad portion PP2 in the display area DA. Therefore, the first planarization layer 181 is not positioned between the second electrode layer L2 and the third electrode layer L3, and the third electrode layer 13 may be positioned on the second electrode layer L2. The third electrode layer L3 may cover the second electrode layer L2.

An organic layer OL may be positioned on the third electrode layer L3. The organic layer OL may be positioned to suppress generation of cracks from the pad PD or the insulating layers 111, 120, 141, 142, 161, 143, and 162 when the integrated circuit chip 30 is bonded. That is, the organic layer OL may be a buffer layer for buffering a force applied to the pad PD. The organic layer OL may have a thickness t of about 0.5 μm to about 2.5 μm or about 0.5 μm to about 1.6 μm in a region overlapping the contact hole H. The organic layer OL may be a quadrangle in a plan view (e.g., a view perpendicular or normal with respect to a display surface). The organic layer OL may have a width that is equal to or greater than 2 μm. The organic layer OL may be formed to be about 10% to about 95% of the area of the third electrode layer L3 by considering an arrangement margin with the bump of the integrated circuit chip 30 and the contact of the third electrode layer L3 and the fourth electrode layer L4.

The organic layer OL may overlap the entire region of the contact hole H. An upper surface of the organic layer OL may be flat or planar in the region overlapping at least contact hole H. The thickness t of the organic layer OL may be substantially constant in the region overlapping the contact hole H. The upper surface of the organic layer OL may be flat or planar in the region not overlapping the region overlapping the contact hole H.

The organic layer OL may be on a same layer as the second planarization layer 182 of the display area DA or the pixel defining layer 360. For example, the organic layer OL may be formed together with the second planarization layer 182 and the contact hole of the second planarization layer 182 by forming a second data conductive layer, applying an organic insulating material on the display area DA and the pad portion PP2, and performing patterning thereon. The organic layer OL may be formed together with the pixel defining layer 360 by forming a second data conductive layer, applying an organic insulating material on the display area DA and the pad portion PP2, and performing patterning thereon. Therefore, no additional process and mask for forming the organic layer OL may be utilized.

The organic layer OL may be formed by using a halftone mask. For example, when the organic layer OL includes a positive photosensitive material, in the halftone mask region corresponding to one pad PD, a halftone exposure area may be about 10% to about 200% of the area generated by subtracting the contact area of the first electrode layer L1 and the second electrode layer L2 from the area of the first electrode layer L1, and a non-exposure area may be generated by subtracting the halftone exposure area from the about 10% to about 95% of the third electrode layer L3 area. For example, the region overlapping the insulating layers 142, 161, 143, and 162 may correspond to the halftone exposure region on the organic layer OL, and the region overlapping the contact hole H may correspond to the non-exposure region. As described, when the organic layer OL is formed by use of the halftone mask, a height of the region overlapping the insulating layers 142, 161, 143, and 162 may be reduced on the organic layer OL, thereby improving the flatness of the upper surface of the organic layer OL. According to some embodiments, when the organic layer OL includes a negative photosensitive material, the above-noted non-exposure region may be a full tone exposure region.

An edge of the third electrode layer L3 may be cladded by the first insulating layer 410 and/or the second insulating layer 420.

A fourth electrode layer L4 may be positioned on the organic layer OL. The fourth electrode layer L4 may be the top layer TL of the pad PD. The fourth electrode layer L4 may contact a bump of the integrated circuit chip 30 or conductive particles of the anisotropic conductive layer. The fourth electrode layer L4 may be made of a same material in a same process as the touch electrode 451 of the touch portion 200 of the display area DA. That is, the second touch conductive layer may include a touch electrode 451 and a fourth electrode layer L4. The fourth electrode layer L4 may not be covered by the organic layer OL on the third electrode layer L3, and may contact a portion that is not covered by the first insulating layer 410 and/or the second insulating layer 420. A region in which the fourth electrode layer L4 contacts the third electrode layer L3 may overlap the insulating layers 142, 161, 143, and 162, and may not overlap the contact hole H.

The fourth electrode layer L4 may cover the organic layer OL. The organic layer OL may be formed by coating a polymer solution including a material such as a solvent, an initiator, and a binder and curing the same. A material remaining in the organic layer OL or a decomposed material may be discharged as gas for a following process after the formation of the organic layer OL and/or while using the display device. This phenomenon will be referred to as outgassing. The fourth electrode layer L4 may be blistered by the discharged gas (or outgas), so the fourth electrode layer L4 may include at least one opening OP through which the outgas may be discharged. An area of the opening OP may be equal to or greater than about 1% of the area of the fourth electrode layer L4.

When the upper surface of the organic layer OL is planar, the upper surface of the fourth electrode layer L4 may be planar. The upper surface of the fourth electrode layer L4 may be planar in a region overlapping at least the contact hole H.

The fourth electrode layer L4 of the pad PD contacts the third electrode layer L3, the third electrode layer L3 contacts the second electrode layer L2, and the second electrode layer L2 contacts the first electrode layer L1, so the signal input through the fourth electrode layer L4 may be transmitted to the wire through the third electrode layer L3, the second electrode layer L2, and the first electrode layer L1. At least one of the illustrated insulating layers 111, 120, 141, 142, 161, 143, or 162 may not be positioned on the pad portion PP2.

Embodiments described with reference to FIG. 4C are different from embodiments described with reference to FIG. 4B, regarding the first electrode layer L1 of the pad PD. Referring to FIG. 4C, the first electrode layer L1 may be positioned between the first gate insulating layer 141 and the second gate insulating layer 142. The first electrode layer L1 may be made of a same material in a same process as the light blocking layer LB of the display area DA and the upper electrode C2 of the storage capacitor. That is, the second gate conductive layer may include a light blocking layer LB, an upper electrode C2, and a first electrode layer L1. The second electrode layer L2 may contact the first electrode layer L1 through the contact hole H formed in the first inter-layer insulating layer 161, the third gate insulating layer 143, and the second inter-layer insulating layer 162.

Regarding one of the neighboring pads PD of the pad portion PP2, the first electrode layer L1 may be formed to be a first gate conductive layer as shown in FIG. 4B, and regarding the other thereof, the first electrode layer L1 may be formed to be a second gate conductive layer as shown in FIG. 4C. The first electrode layer L1 of the pad PD may be made of a same material in a same process as the gate electrode G2 of the second transistor TR2, that is, the third gate conductive layer.

The pads PD are arranged on the pad portion PP2 to which the integrated circuit chip 30 is bonded. The pads PD may include pads for transmitting signals (e.g., image data, signals relating thereto, and power) to the integrated circuit chip 30 and pads for receiving signals (e.g., a data voltage and a gate driver controlling signal) from the integrated circuit chip 30.

Figure 5:
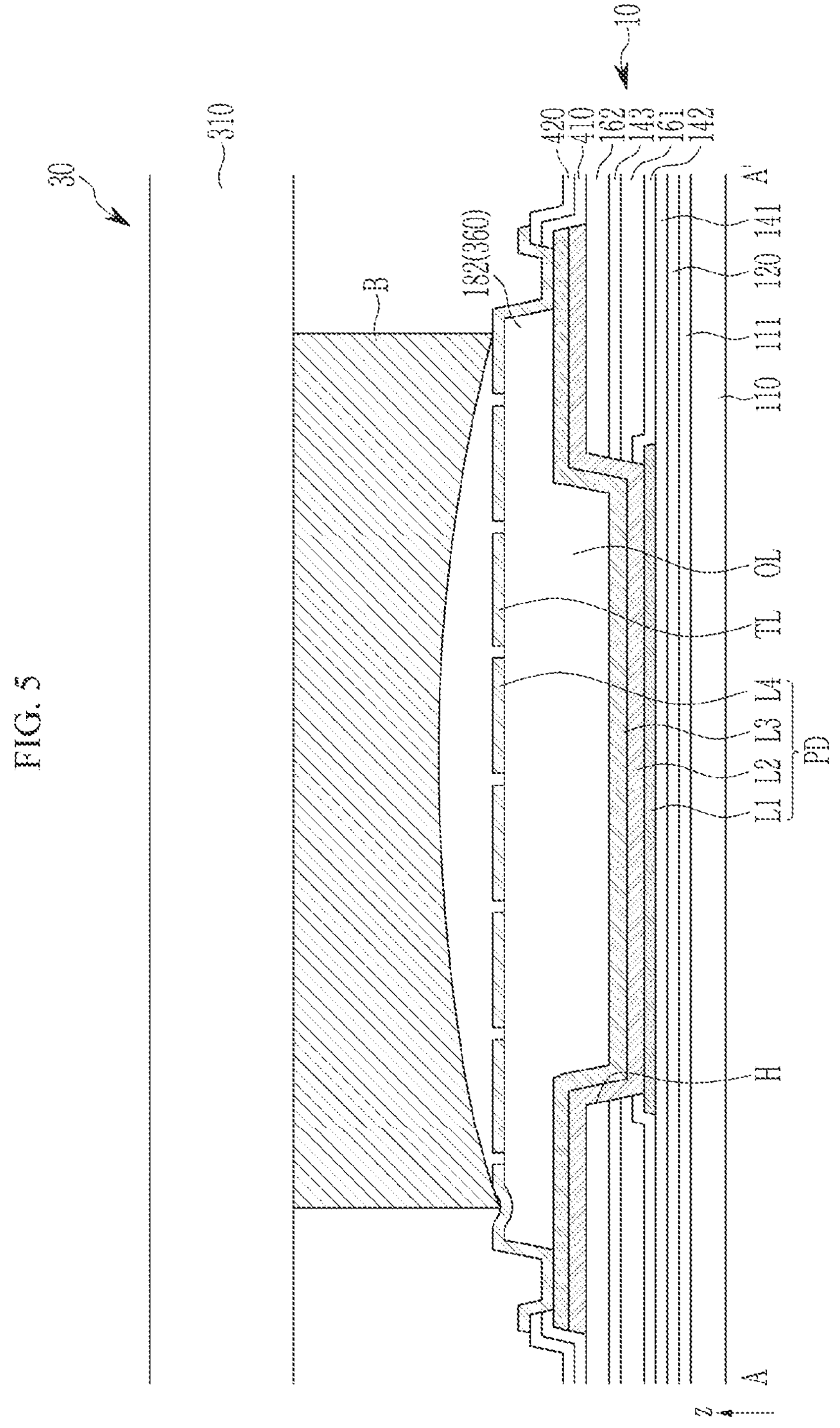
FIG. 5 shows that a bump is compressed to a pad in a display device according to some embodiments.

FIG. 5 shows that a bump is compressed to a pad in a display device according to some embodiments.

Referring to FIG. 5, the integrated circuit chip 30 bonded to the pad portion PP2 of the display panel 10 may include a substrate 310 and a bump B protruding downward from the substrate 310. The bonding of the integrated circuit chip 30 may be performed by compressing the integrated circuit chip 30 after arranging an anisotropic conductive layer on the pad portion PP2 and arranging the integrated circuit chip 30. In this instance, the force may be focused on the pad PD contacting the bump B such that the pad PD or the insulating layers 111, 120, 141, 142, 161, 143, and 162 may be cracked. The contact hole H is formed in the insulating layers 142, 161, 143, and 162 that may be inorganic insulating layers so as to connect the second electrode layer L2 of the pad PD to the first electrode layer L1, so the step of the pad PD may be big, a compression force may be further concentrated on the region overlapping the insulating layers 142, 161, 143, and 162, and a possibility of generation of cracks may be increased. When the pad PD is cracked, defects such as a short circuit or an increase of resistance may be generated. The cracks generated to the insulating layers 111, 120, 141, 142, 161, 143, and 162 may be transmitted to the pad PD or the wire.

When an organic layer OL is positioned below an uppermost layer UP of the pad PD in a like manner according to some embodiments, the organic layer OL buffers or receives a force applied to the pad PD, thereby suppressing generation of cracks on the pad PD and the insulating layers 111, 120, 141, 142, 161, 143, and 162. The organic layer OL may be a crack suppressing layer in a functional way. The organic layer OL has a smaller modulus than that of the metal layer or the inorganic layer, so it has a small stress on a strain, it is not easily cracked, and it is not easily shrunk. The organic layer OL may be formed to be an organic insulating layer formed in the display area DA, so additional processing for forming an organic layer OL may not be needed.

FIG. 6, FIG. 7, FIG. 8, and FIG. 9 show cross-sectional views with respect to a line A-A' of FIG. 4A according to some embodiments. Differences between several embodiments of the pad PD and the above-described embodiments will be mainly described.

Figure 6:
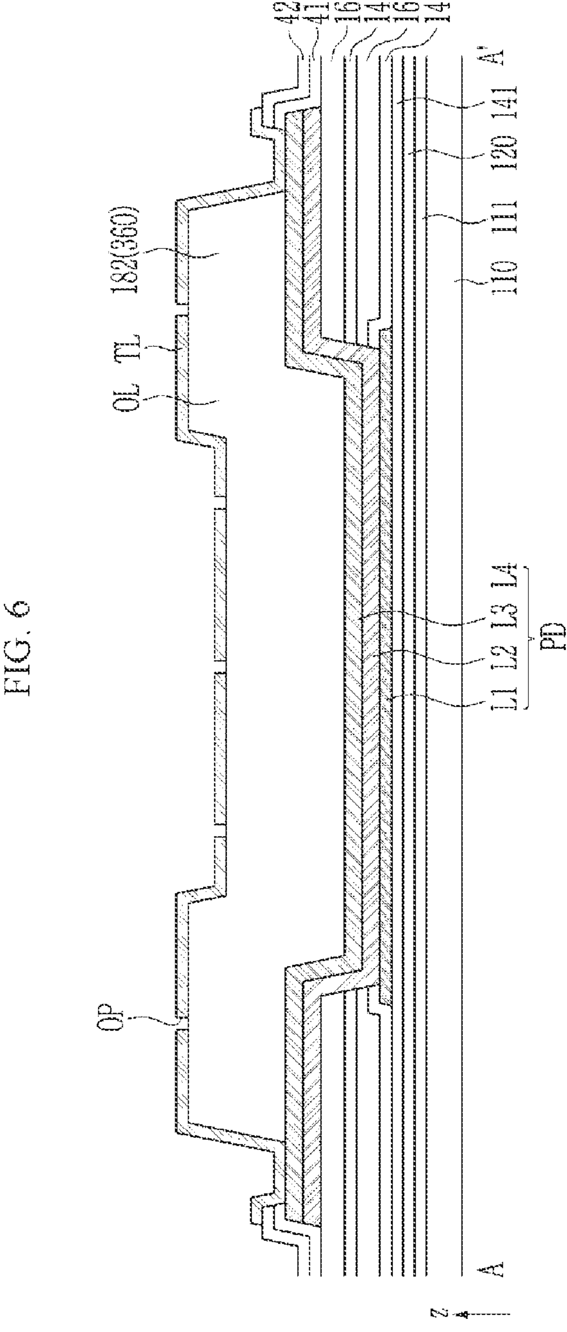
FIG. 6, FIG. 7, FIG. 8, and FIG. 9 show cross-sectional views with respect to a line A-A' of FIG. 4A according to some embodiments.

Referring to FIG. 6, the pad PD may include a first electrode layer L1, a second electrode layer L2, a third electrode layer L3, and a fourth electrode layer L4 sequentially positioned on the substrate 110. An organic layer OL may be positioned between the third electrode layer L3 and the fourth electrode layer L4.

The organic layer OL may be formed so that a first portion overlapping the contact hole H and a second portion not overlapping the same may have a step. A thickness t1 of the first portion of the organic layer OL may be similar to a thickness t2 of the second portion. The second portion of the organic layer OL may be higher than the first portion with respect to the surface of the substrate 110. Because of the shape and structure of the organic layer OL, the pad PD may have a center region that is concave. In the above-noted structure of the pad PD, conductive particles of an anisotropic conductive layer for electrically connecting the pad PD and the bump B may be induced to the center region of the pad PD, and an arrival rate or a trap rate of the conductive particles may increase.

Figure 7:
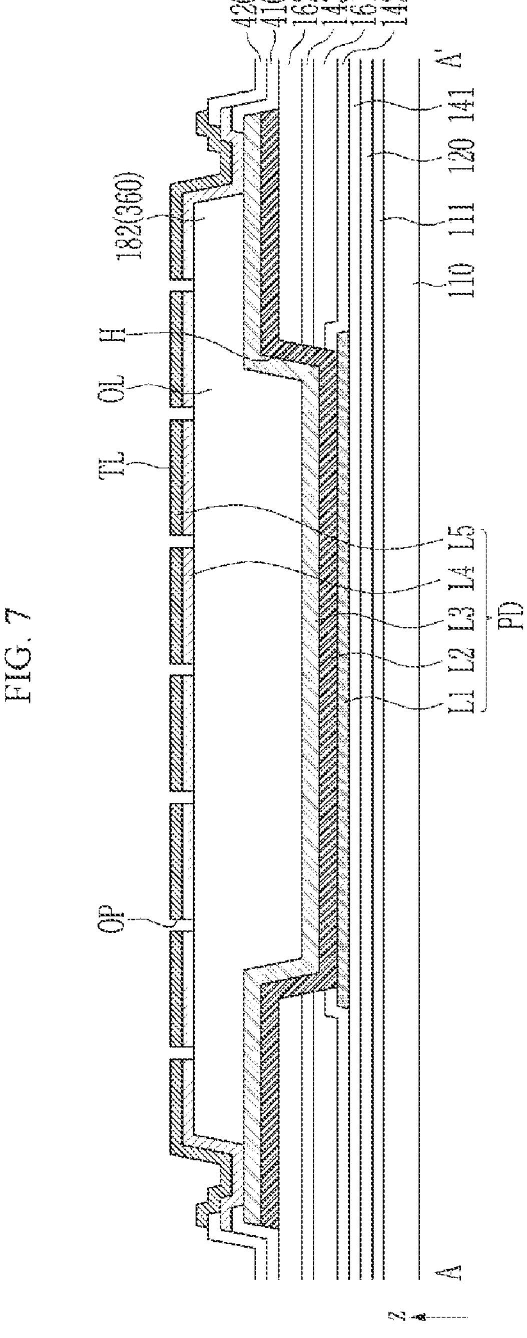

Referring to FIG. 7, the pad PD may include a first electrode layer L1, a second electrode layer L2, a third electrode layer L3, a fourth electrode layer L4, and a fifth electrode layer L5 sequentially positioned on the substrate 110. An organic layer OL that may be a same layer as the second planarization layer 182 or the pixel defining layer 360 may be positioned between the third electrode layer L3 and the fourth electrode layer L4.

The fifth electrode layer L5 may be the top layer TL of the pad PD. The fourth electrode layer L4 positioned below the fifth electrode layer L5 may be made of a same material in a same process as the bridge 452 of the touch portion 200 of the display area DA. That is, the first touch conductive layer may include the bridge 452 and the fourth electrode layer L4. An edge of the fourth electrode layer L4 may be cladded by the second insulating layer 420. The fourth electrode layer L4 may not be covered by the organic layer OL on the third electrode layer L3 and may contact a portion that is not covered by the first insulating layer 410. The fifth electrode layer L5 may be made of a same material in a same process as the touch electrode 451. That is, the second touch conductive layer may include a touch electrode 451 and a fifth electrode layer L5. The fourth electrode layer L4 and the fifth electrode layer L5 may include an opening OP penetrating through the electrode layers L4 and L5 so that the outgas of the organic layer OL may be discharged. The upper surface of the organic layer OL may be planar, and it may have steps in a like manner of embodiments described with reference to FIG. 6.

Figure 8:
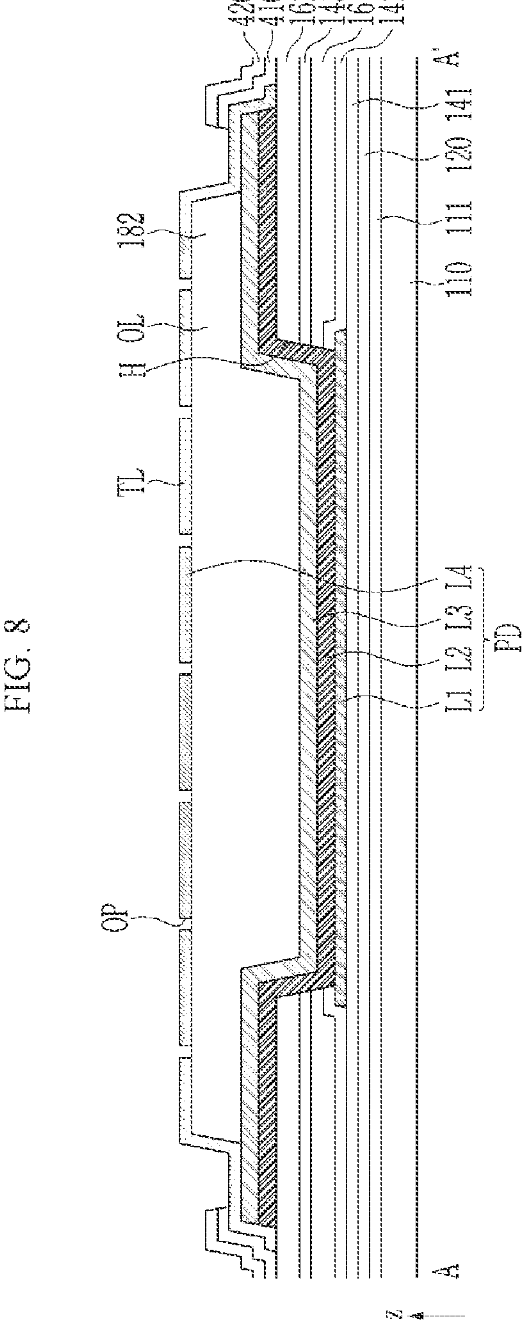

Referring to FIG. 8, the pad PD may include a first electrode layer L1, a second electrode layer L2, a third electrode layer L3, and a fourth electrode layer L4 sequentially positioned on the substrate 110. An organic layer OL may be positioned between the third electrode layer L3 and the fourth electrode layer L4. The fourth electrode layer L4 that is the top layer TL of the pad PD may be made of a same material in a same process as the pixel electrode 191. That is, the pixel electrode layer may include a pixel electrode 191 and a fourth electrode layer L4. The fourth electrode layer L4 may contact a portion that is not covered by the organic layer OL on the third electrode layer L3. The fourth electrode layer L4 may cover a lateral side of the third electrode layer L3, and may contact the lateral side of the third electrode layer L3. An edge of the fourth electrode layer L4 may be or may not be cladded by the first insulating layer 410 and/or the second insulating layer 420. The upper surface of the organic layer OL may be planar, and may also have steps in a like manner of embodiments described with reference to FIG. 6.

Figure 9:
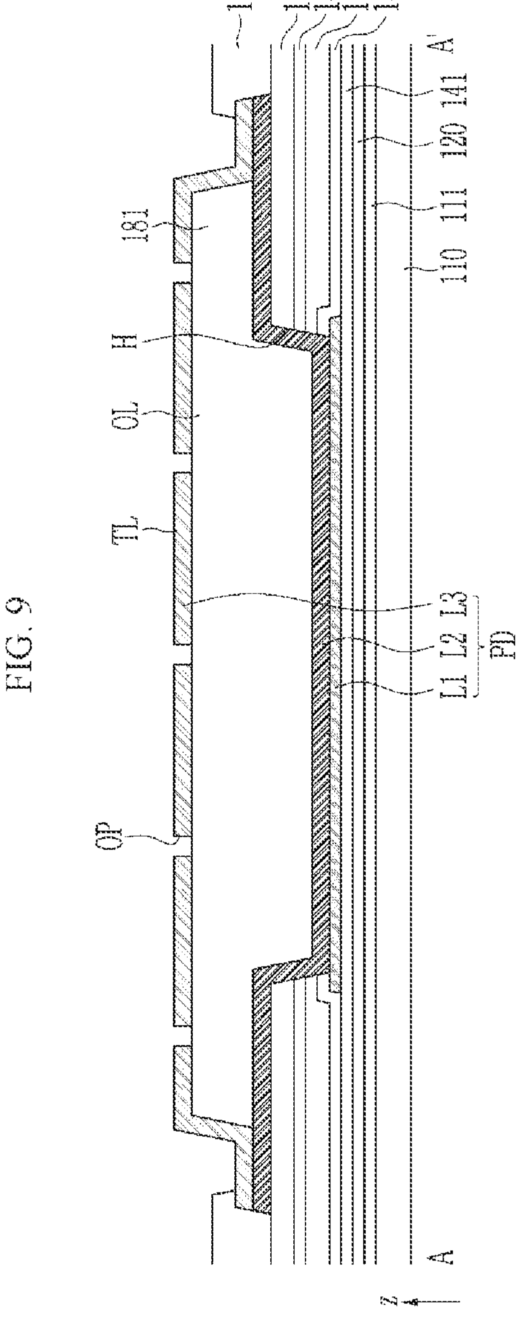

Referring to FIG. 9, the pad PD may include a first electrode layer L1, a second electrode layer L2, and a third electrode layer L3 sequentially positioned on the substrate 110. The third electrode layer L3 may be the top layer TL of the pad PD. An organic layer OL may be positioned between the second electrode layer L2 and the third electrode layer L3. The organic layer OL may be a same layer as the first planarization layer 181. For example, the organic layer OL may be formed together with the first planarization layer 181 and the contact hole of the first planarization layer 181 by applying an organic insulating material on the display area DA and the pad portion PP2 and performing patterning thereon after forming a first data conductive layer. The organic layer OL may be formed to be about 10% to about 95% of the area of the second electrode layer L2 by considering an arrangement margin of the integrated circuit chip 30 with the bump and the contact of the second electrode layer L2 and the third electrode layer L3.

The first electrode layer L1 may be a first gate conductive layer or a second gate conductive layer, and the second electrode layer L2 may be a first data conductive layer, while the third electrode layer L3 may be a second data conductive layer. The third electrode layer L3 may have an opening OP so that the outgas of the organic layer OL may be discharged. An edge of the third electrode layer L3 may be cladded by the second planarization layer 182. An edge of the third electrode layer L3 may or may not be cladded by the first insulating layer 410 and/or the second insulating layer 420. The third electrode layer L3 may be a pixel electrode layer or a second touch conductive layer. The upper surface of the organic layer OL may be planar, but may have steps in a like manner of embodiments described with reference to FIG. 6.

Figure 10A:
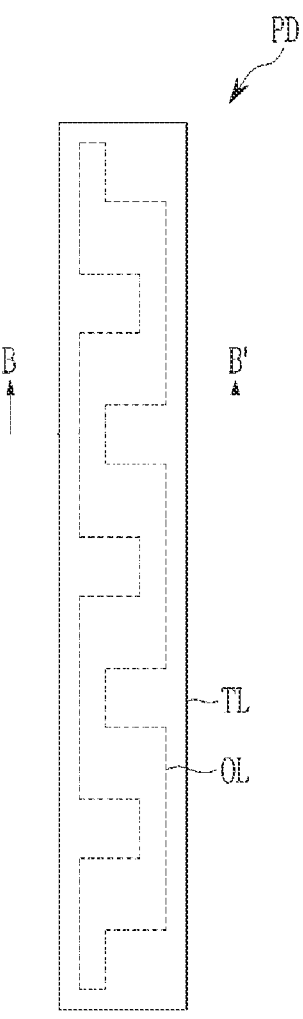
FIG. 10A shows a top plan view of a pad according to some embodiments.
Figure 10B:
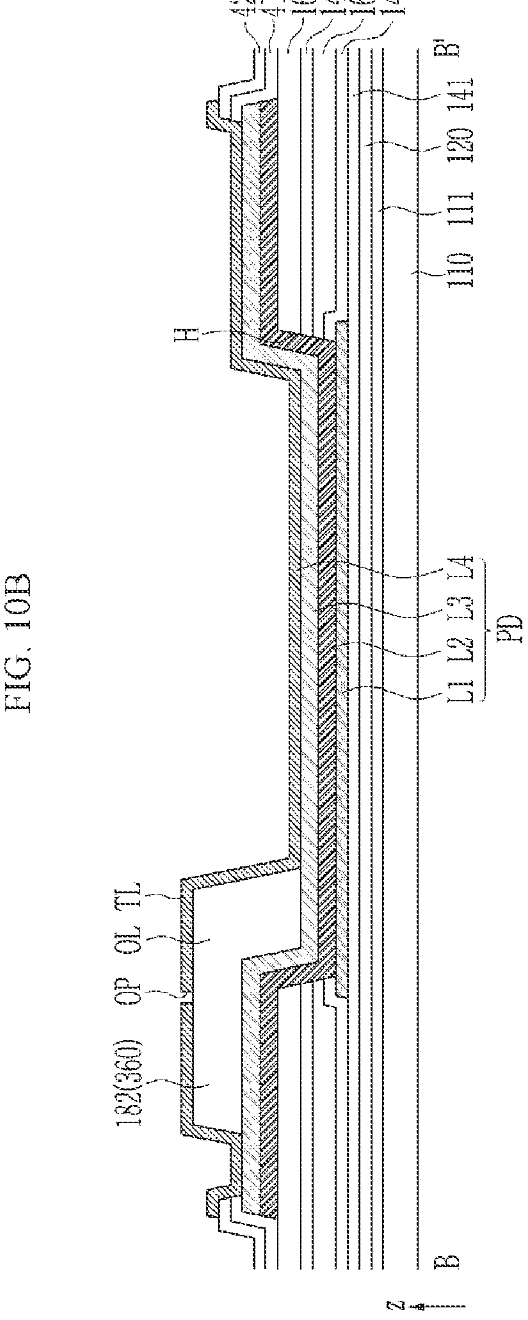
FIG. 10B shows a cross-sectional view with respect to a line B-B' of FIG. 10A.

FIG. 10A shows a top plan view of a pad according to some embodiments, and FIG. 10B shows a cross-sectional view with respect to a line B-B' of FIG. 10A.

Referring to FIG. 10A and FIG. 10B, the pad PD may include a first electrode layer L1, a second electrode layer L2, a third electrode layer L3, and a fourth electrode layer L4, and an organic layer OL may be positioned between the third electrode layer L3 and the fourth electrode layer L4 in a like manner of embodiments described with reference to FIG. 4B. However, the organic layer OL may not be positioned in most of the region of the pad PD but may be positioned in a certain region (e.g., a set or predetermined region) or portion of the pad PD. For example, the organic layer OL may be positioned or formed to extend in a length direction of the pad PD in a winding way (e.g., various vertical/horizontal, zigzag, or curving segments). When the organic layer OL is formed as described above, the contact area of the third electrode layer L3 and the fourth electrode layer L4 may further increase than embodiments described with reference to FIG. 4B, so contact resistance may be reduced. The conductive particles may be induced to the region in which the organic layer OL is not formed.

Figure 11A:
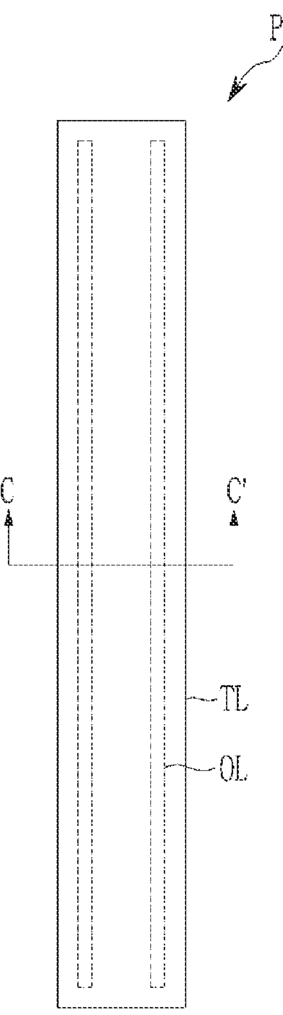
FIG. 11A shows a top plan view of a pad according to some embodiments.

FIG. 11A shows a top plan view of a pad according to some embodiments, and FIG. 10B shows a cross-sectional view with respect to a line C-C' of FIG. 11A.

Figure 11B:
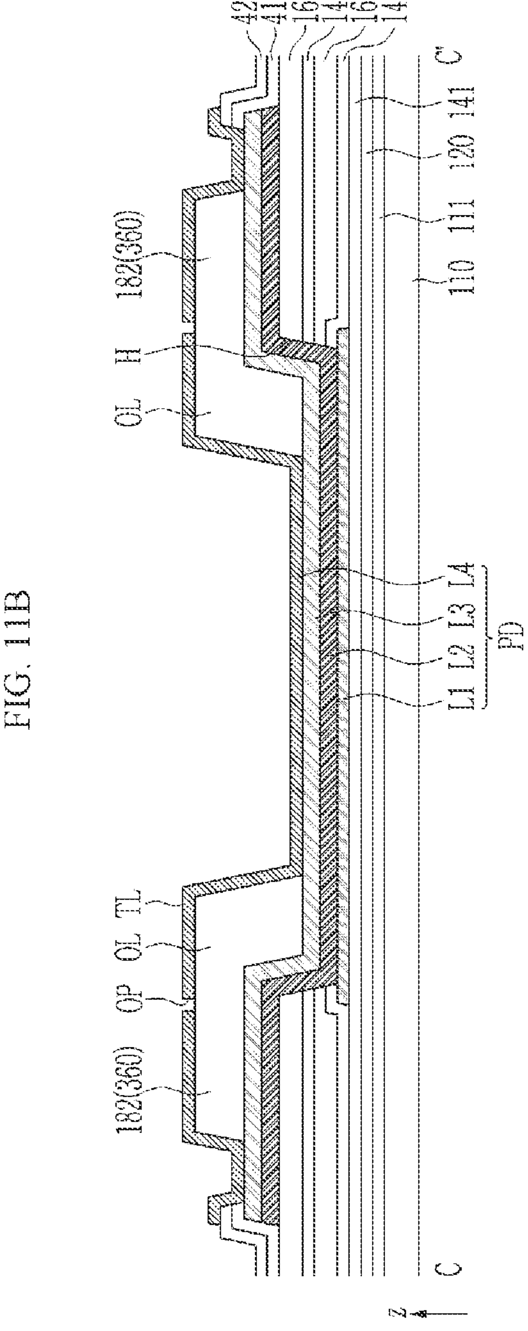
FIG. 11B shows a cross-sectional view with respect to a line C-C' of FIG. 11A.

Referring to FIG. 11A and FIG. 11B, the organic layer OL that may be positioned between the third electrode layer L3 of the pad PD and the fourth electrode layer L4 may include two portions extending in the long-side direction of the pad PD and separated from each other. The organic layer OL may not be positioned in the center region of the pad PD. The organic layer OL may be positioned in the contact hole H and on the insulating layers 142, 161, 143, and 162. The organic layer OL may not overlap the contact hole H. When the organic layer OL is arranged as described above, the third electrode layer L3 contacts the fourth electrode layer L4 in the center region of the pad PD, thereby reducing contact resistance. The conductive particles may be induced to the center region of the pad PD.

Figure 12A:
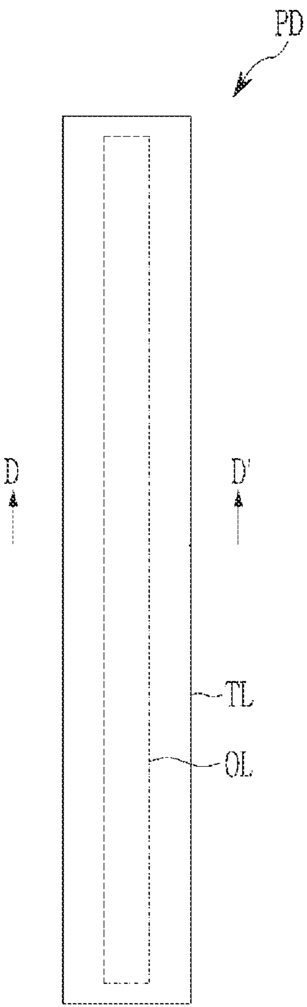
FIG. 12A and FIG. 12B respectively show a top plan view of a pad according to some embodiments.
Figure 12B:
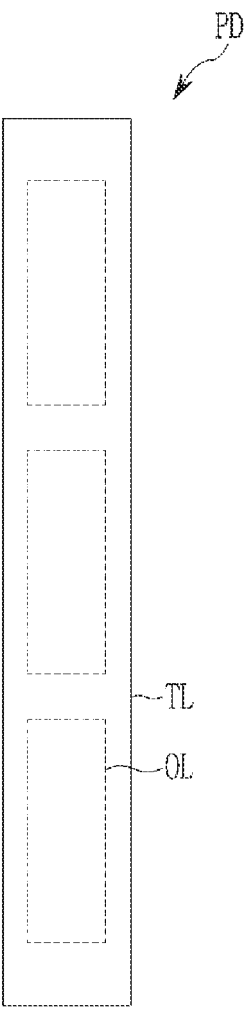
Figure 12C:
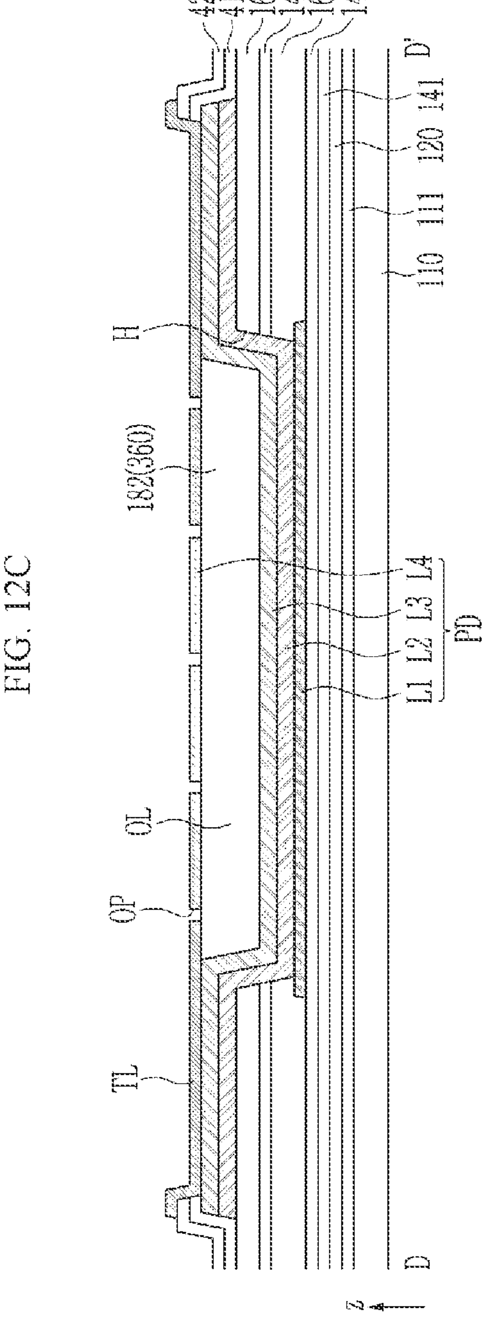
FIG. 12C shows a cross-sectional view with respect to a line D-D' of FIG. 12A.

FIG. 12A and FIG. 12B respectively show a top plan view of a pad according to some embodiments, and FIG. 12C shows a cross-sectional view with respect to a line D-D' of FIG. 12A.

Referring to FIG. 12A, FIG. 12B, and FIG. 12C, the organic layer OL may be positioned not in the edge region of the pad PD but in the center region. The organic layer OL may be sequentially positioned in the length direction of the pad PD as shown in FIG. 12A, and may be discontinuously position as shown in FIG. 12B. As described, when the organic layer OL is located in the center region of the pad PD, the steps caused by the contact hole H formed in the insulating layers 142, 161, 143, and 162 for connecting the second electrode layer L2 to the first electrode layer L1 may be reduced. Accordingly, the top layer TL of the pad PD may be planar in the region in which the top layer TL overlaps the contact hole H and the region in which the top layer TL does not overlap it, or steps may be reduced.

The arrangement of the organic layer OL according to embodiments described with reference to FIG. 10A, FIG. 10B, FIG. 11A, FIG. 11B, FIG. 12A, FIG. 12B, and FIG. 12C is applicable to the case in which the organic layer OL is positioned between the second electrode layer L2 and the third electrode layer L3 of the pad PD in a like manner of the embodiments described with reference to FIG. 9.

The pads PD described in the above-described embodiments may be pads connected to the output terminals of the integrated circuit chip 30. The pads connected to the input terminals of the integrated circuit chip 30 and/or the pads of the pad portion PP1 may have a same structure as the pads PD.

FIG. 13A, FIG. 13B, FIG. 13C, FIG. 13D, and FIG. 13E respectively show a top plan view of illustrating an organic film on a pad portion according to some embodiments.

The pads PD of the pad portion PP2 may have the structures according to the above-described embodiments. Some pads PD may have the above-described structures according to regions of the pad portion PP2. When the integrated circuit chip 30 is bonded, the force may be further applied to a specific region on the pad portion PP2 depending on a characteristic of the anisotropic conductive layer and the processing method. The cracks may be more probably generated in the region to which the force may further be applied, so the organic layer OL may be selectively arranged between the electrode layers (e.g., between the third electrode layer L3 and the fourth electrode layer L4 or between the second electrode layer L2 and the third electrode layer L3) of the pads PD in such region.

Figure 13A:
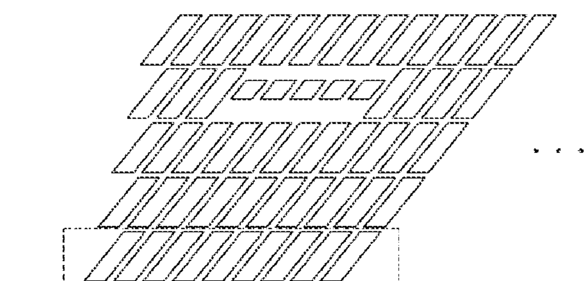
Figure 13B:
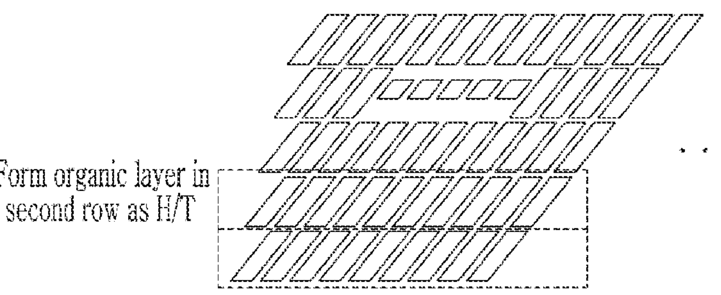

For example, referring to FIG. 13A, the organic layer OL may be positioned on the pads PD in a first bottom row or a first top row from among a plurality of pad rows. Referring to FIG. 13A, the pads PD in the first row may be formed to be thick by non-exposure or full-tone exposure on the organic layer OL, and the pads PD in the second row may be formed to be thin by halftone exposure on the organic layer OL.

Figure 13C:
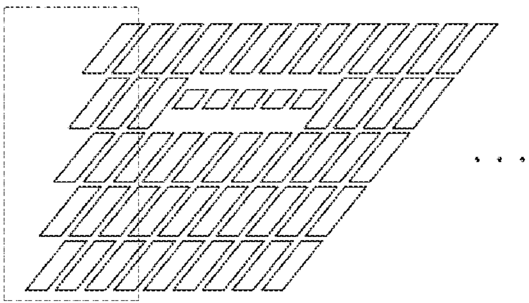
Figure 13D:
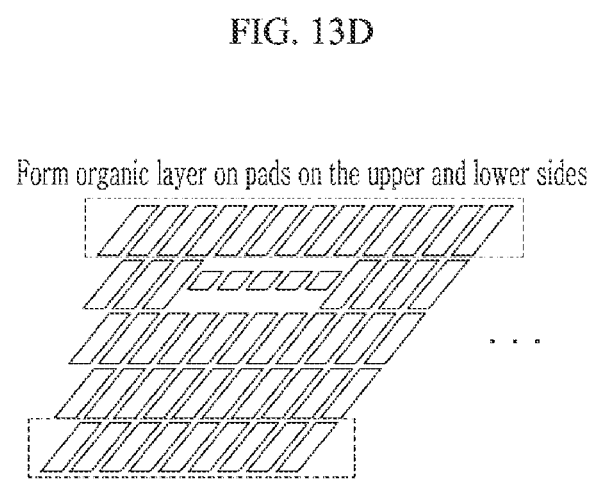
Figure 13E:
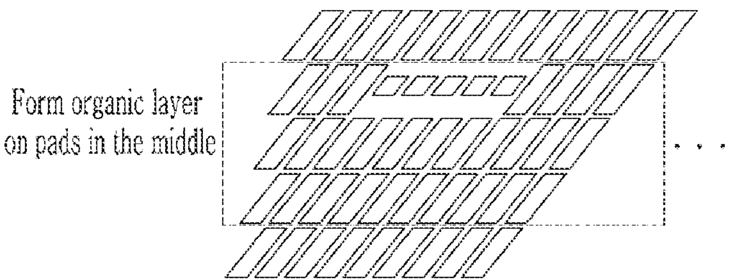

Referring to FIG. 13C, the organic layer OL may be positioned on the pads PD positioned in the left region and the right region on the pad portion PP2. Referring to FIG. 13D, the organic layer OL may be positioned on the pads PD in the first bottom row and the first top row. Referring to FIG. 13E, the organic layer OL may be positioned on the pads PD in the center portion.

While aspects of some embodiments of the inventive concept have been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims, and their equivalents.

What is claimed is:

1. A display device comprising:

a substrate including a display area and a non-display area; and a pad in the non-display area to which a terminal of an integrated circuit chip is connected, wherein the integrated circuit chip overlaps the pad in a plan view, wherein the pad includes a first electrode layer, a second electrode layer, a third electrode layer, and a fourth electrode layer sequentially on the substrate, the second electrode layer contacts the first electrode layer through a contact hole in a plurality of insulating layers, the third electrode layer runs along a contour of the second electrode layer, the fourth electrode layer forms a top layer of the pad, and an upper surface of the top layer is not covered by an insulating layer of the display device, and an organic layer in the contact hole and between the third electrode layer and the fourth electrode layer, with an opening through the fourth electrode layer overlapping the contact hole along a vertical direction.

2. The display device of claim 1, wherein the organic layer overlaps an entirety of the contact hole.

3. The display device of claim 2, wherein an upper surface of the organic layer is flat in a region overlapping the contact hole.

4. The display device of claim 1, wherein the organic layer overlaps the contact hole and the plurality of insulating layers, and an upper surface of the organic layer is flat in a region overlapping the contact hole and a region not overlapping the contact hole.

5. The display device of claim 1, wherein an insulating layer is not between the second electrode layer and the third electrode layer.

6. The display device of claim 1, wherein the fourth electrode layer includes the opening overlapping the organic layer.

7. The display device of claim 1, wherein the pad further includes a fifth electrode layer on the fourth electrode layer.

8. The display device of claim 7, wherein the fourth electrode layer and the fifth electrode layer include the opening overlapping the organic layer.

9. The display device of claim 1, wherein the organic layer extends in a length direction of the pad in a winding way.

10. The display device of claim 1, further comprising a first gate insulating layer, a first gate conductive layer, a second gate insulating layer, a second gate conductive layer, a first inter-layer insulating layer, a first data conductive layer, a first planarization layer, a second data conductive layer, and a second planarization layer sequentially on the substrate in the display area, wherein the second electrode layer is on a same layer as the first data conductive layer, the third electrode layer is on a same layer as the second data conductive layer, and the organic layer is on a same layer as the second planarization layer.

11. The display device of claim 10, wherein the plurality of insulating layers include the second gate insulating layer and the first inter-layer insulating layer.

12. The display device of claim 10, further comprising a third gate insulating layer and a second inter-layer insulating layer between the first inter-layer insulating layer and the first planarization layer in the display area, wherein the plurality of insulating layers include the second gate insulating layer, the first inter-layer insulating layer, the third gate insulating layer, and the second inter-layer insulating layer.

13. The display device of claim 1, further comprising a first gate conductive layer, a second gate conductive layer, a first data conductive layer, a second data conductive layer, and a pixel defining layer sequentially on the substrate in the display area, wherein the first electrode layer is on a same layer as the first gate conductive layer or the second gate conductive layer, the second electrode layer is on a same layer as the first data conductive layer, the third electrode layer is on a same layer as the second data conductive layer, and the organic layer is on a same layer as the pixel defining layer.

14. A display device comprising:

a substrate including a display area and a non-display area; and a pad in the non-display area to which a terminal of an integrated circuit chip is connected, wherein the integrated circuit chip overlaps the pad in a plan view, wherein the pad includes a first electrode layer, a second electrode layer, and a third electrode layer sequentially on the substrate, the second electrode layer contacts the first electrode layer through a contact hole in a plurality of insulating layers, an organic layer in the contact hole and between the second electrode layer and the third electrode layer, an edge of the third electrode layer is cladded by an insulating layer, the third electrode layer forms a top layer of the pad, and an upper surface of the top layer is not covered by an insulating layer of the display device, and the organic layer overlaps an entirety of the contact hole, with an opening through the third electrode layer overlapping the contact hole in a plan view along a vertical direction.

15. The display device of claim 14, wherein an upper surface of the organic layer is flat in a region overlapping the contact hole.

16. The display device of claim 14, wherein the organic layer overlaps the contact hole and a plurality of insulating layers, and an upper surface of the organic layer is flat in a region overlapping the contact hole and a region not overlapping the contact hole.

17. The display device of claim 14, wherein the third electrode layer includes the opening overlapping the organic layer.

18. The display device of claim 14, further comprising a first gate insulating layer, a first gate conductive layer, a second gate insulating layer, a second gate conductive layer, a first inter-layer insulating layer, a first data conductive layer, a first planarization layer, a second data conductive layer, and a second planarization layer sequentially on the substrate in the display area, wherein the second electrode layer is on a same layer as the first data conductive layer, the third electrode layer is on a same layer as the second data conductive layer, and the organic layer is on a same layer as the second planarization layer.

19. The display device of claim 18, wherein the plurality of insulating layers include the second gate insulating layer and the first inter-layer insulating layer.

20. The display device of claim 18, further comprising a third gate insulating layer and a second inter-layer insulating layer between the first inter-layer insulating layer and the first planarization layer in the display area, wherein the plurality of insulating layers include the second gate insulating layer, the first inter-layer insulating layer, the third gate insulating layer, and the second inter-layer insulating layer.

* * * * *